(12) United States Patent
Drach et al.

(10) Patent No.: US 6,859,111 B1
(45) Date of Patent: Feb. 22, 2005

(54) VOLTAGE TUNED FERROELECTRIC RESONANT OSCILLATOR

(75) Inventors: William C. Drach, West Long Branch, NJ (US); Mark Bates, Doylestown, PA (US)

(73) Assignee: The United States of America as represented by the Secretary of the Army, Washington, DC (US)

(*) Notice: Subject to any disclaimer, the term of this patent is extended or adjusted under 35 U.S.C. 154(b) by 93 days.

(21) Appl. No.: 10/456,165

(22) Filed: Jun. 4, 2003

(51) Int. Cl.[7] .................................................. H03B 5/18
(52) U.S. Cl. ............ 331/96; 331/107 SL; 331/107 DP; 331/117 D

(58) Field of Search .............................. 331/96, 107 SL, 331/107 DP, 117 D; 333/219.1

(56) References Cited

U.S. PATENT DOCUMENTS 6,078,223 A * 6/2000 Romanofsky et al. ......... 331/9
6,603,367 B2 * 8/2003 Pao et al. ................ 331/177 V

* cited by examiner

Primary Examiner—Arnold Kinkead
(74) Attorney, Agent, or Firm—Edward L. Stolarun

(57) ABSTRACT

Burnout resistance ferroelectric material is used in the feedback path of a microwave oscillator as a frequency control element. The ferractor has rapid broadband frequency tuning capabilities limited only by the speed of an external DC source.

10 Claims, 2 Drawing Sheets

VOLTAGE TUNED FERROELECTRIC RESONANT OSCILLATOR

GOVERNMENTAL INTEREST

The invention described herein may be manufactured, used and licensed by or for the United States Government for governmental purposes.

BACKGROUND OF THE INVENTION

A need has existed for an extended period of time, in the armed services and industry, for an oscillator having the ability to generate an RF signal from a D.C. power source which has the capability of rapidly selecting different RF output frequencies. This need is particularly acute in applications by frequency agile sources used in electronic warfare and communication links. Commercial applications for the invention will include the use in transmitters and receivers using phased-locked loops to stabilize a desired frequency. Prior art devices did not provide a reliable method to control a wide range of frequencies without concern for "burning out" or the need for shielding of the ferroelectric frequency control material when used in pulsed systems with high power or in environments where the generating sources are unstable. Prior art devices using a varactor diode as a variable capacitance for voltage controlled oscillators also were unreliable in high power pulsed systems. The varactor diode was vulnerable under the aforementioned environment whenever the maximum current rating was exceeded.

SUMMARY OF THE INVENTION

The present invention relates to a voltage tuned ferrroelectric resonant oscillator which has the capability of rapidly selecting different frequencies in high power pulsed systems.

An object of the present invention is to provide a reliable frequency tuned, "ferractor", oscillator which can control a wide range of frequencies without concern for burn out.

Another object of the present invention is to remove the threat of burn out of a tunable devise under pulsed systems with high power. A further object of the present invention is to provide a tunable ferractor which removes the threat of burn out due to inherent properties of the ferroelectric material being polarity independent.
tunable ferractor which removes the threat of burn out due to inherent properties of the ferroelectric material being polarity independent.

For a better understanding of the present invention, together with other and further objects thereof, reference is made to the following descriptions taken in connection with the accompanying drawings.

DETAILED DESCRIPTION OF THE PREFERRED EMBODIMENTS

Figure 1:
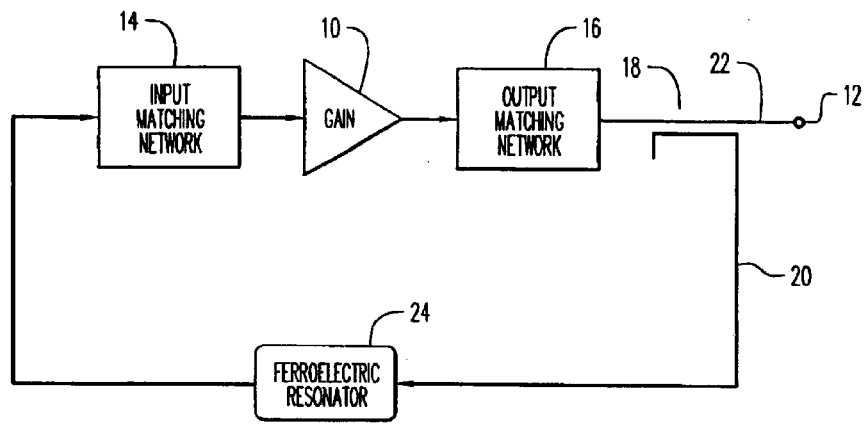
FIG. 1 is a block diagram of a ferroelectric controlled oscillator.

Referring now to FIG. 1 the ferractor circuit comprises an amplification stage 10 which includes one or more amplifiers cascaded together. Additional amplification 25 may be attached to the output port 12 of the oscillator to achieve the required output power level. Input and output matching networks, 14 and 16 respectively, are connected to the amplifier ports. The signal from the output network 16 is then devided at the power split 18 between the feedback path 20 and the output path 22 of the device. This division can take the form of a coupler or a power devider as long as enough energy traverses the feedback loop 20. The ferractor is tuned by placing the ferroelectric material, hereinafter described in the ferroelectric resonator 24 portion of the oscillator circuit. The resonator 24 can be any reactive resonant structure such as a half wave dipole or a microstrip ring resonator, with its dielectric being a ferroelectric material whose effective capacitance is a function of the tuning voltage. This change in capacitance will tune the resonant frequency. The corresponding change in frequency is proportional to the square root of the effective dielectric constant.

Figure 2:
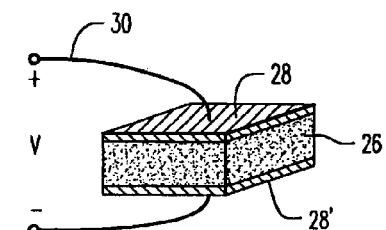
FIG. 2 is an isometric view of ferroelectric material positioned between two metal plates for use as a varactor replacement.
Figure 3:
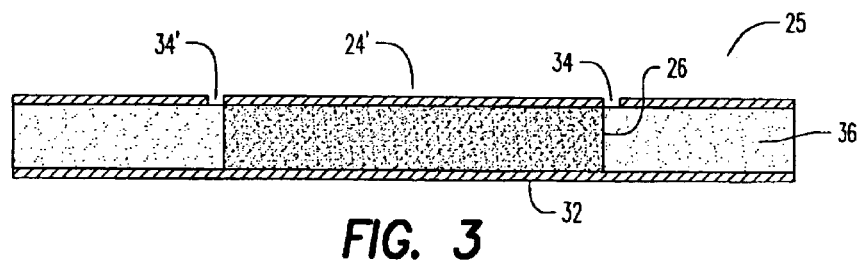
FIG. 3 is a partial cross sectional view of ferroelectric material in a microstrip structure for use as a tunable resonator.

Referring now to FIG. 2 ferroelectric material 26 is metal plated on both sides 28, 28'. A biasing voltage "V" is applied to these plates by conductors 30 and 30' 0respectively, setting up an electric field within the ferroelectric material 26. When used as a resonator, the ferroelectric's permittivity is controlled by an external D.C. source, which is connected in parallel with the capacitance of the microstrip trace 25. The parameters of the microstrip shown in FIGS. 2 and 3, are unaffected by the addition of this field. The bottom plated metal 28' of FIG. 2 is in electrical contact with a ground plane 32. The microstrip trace ground plane 32 is separated from the ferroelectric resonator 24' by coupling gaps 34, 34' and dielectric material 36. The voltage addition changes the resonator's overall capacitance and in turn the resonant frequency. With a given D.C. voltage swing, the amount of capacitive shift can be altered by proper selection of the composition of the ferroelectric material. The ferractor oscillator can be made to tune over a wide bandwidth, comparable with YIG—tuned oscillators, while at the same time, have the rapid tuning speed of a varactor-tuned oscillator.

Figure 4:
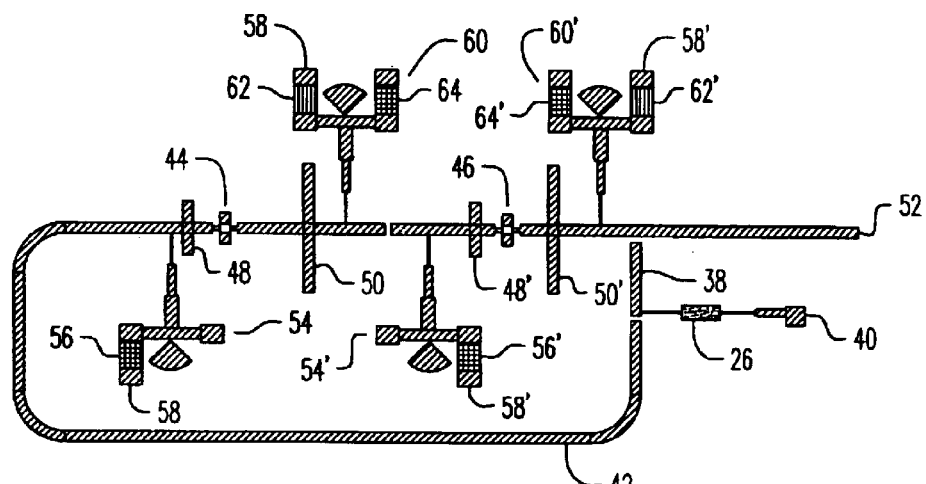
FIG. 4 is an example layout of a frequency tuned ferractor oscillator with ferroelectric material used to change the capacitance of the resonator in a similar fashion to a semiconductor varactor.
Figure 5:
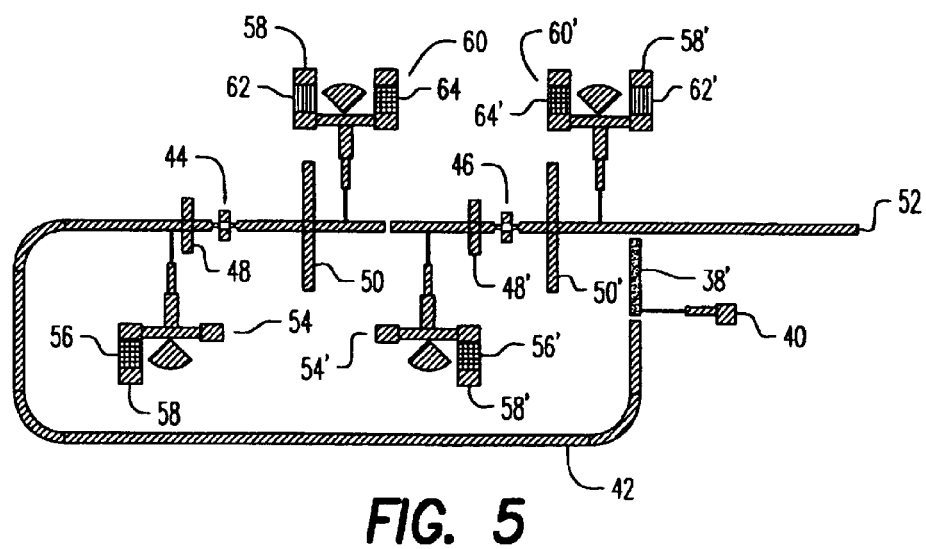
FIG. 5 is an example layout of a frequency tuned ferractor oscillator with the ferractor material located in the resonator portion of the circuit.
Throughout the following description, like numerals are used to denote like parts of the drawings.

Referring now to FIGS. 4 and 5, complete ferractor oscillators are shown with the ferroelectric material used in place of a conventional varactor. FIG. 4 shows the ferroelectric material 26 used to change the capacitance of the resonator 38 in a similar 25 fashion to a semiconductor varactor. FIG. 5 shows the ferroelectric material 38' located in the resonator portion of the circuit. FIGS. 4 and 5 show frequency tuned ferractor oscillator layouts having a ferroelectric voltage driver 40 operatively connected to the ferroelectric material 26 and 38' in feedback loop 42.

In operation the microwave signal goes through one or more amplification stages to boost the signal level. The first amplifier 44 and second amplifier 46 have input and output matching stubs 48, 48' and 50, 50' respectively, to minimize reflection at the ports of the amplifier. Once amplified, a portion of the signal power is coupled, or devided, into the feedback loop which once again amplifies the microwave signal, thereby reaching a steady state after a few iterations through the loop. The amount of energy fed back must cause the loop gain to be greater than unity. The result is a stable RF signal at RF output port 52 with a quality factor (Q) comparable to that of a varactor tuned oscillator. The development of a ferractor controlled oscillator is based on the intrinsic behavior of the ferroelectric material. The example ferractor layouts of FIGS. 4 and 5 include gate bias amplifier input stub elements 54, 54' which include gate resistors 56, 56' electrically coupled to ground via metal conductors 58 and 58' respectively. Each of the amplifiers 44 and 46 include drain bias stubs 60 and 60' respectively which contain resistor and capacitor tank elements 62 and 62' respectively. The aforementioned resistors and capacitances are connected to ground via metal conductors 58, 58'.

In an alternate embodiment the resonant devise, shown in FIG. 5 may be constructed entirely of ferroelectric material. This embodiment creates a distributed effect in which the change in frequency is proportional to the change in the effective wavelength of the signal in the material. Presently, a limitation of this embodiment is that the ferroelectric material has a very high dielectric tangential loss. The device may be constructed using BaxSn1-xTiO3, however any ferroelectric material that exhibits a change in permittivity due to an applied field will work. By using alternate material compositions or changing frequency ranges, a broad range of device performances are obtainable. The size and thickness of the ferroelectric material can be customized for a particular application that requires a particular voltage range or region of frequencies.

While specific embodiments of the invention have been shown and described in detail to illustrate the application of the principles of the invention, it will be understood that the invention may be embodied otherwise without departing from such principles.

What is claimed is:

1. A voltage tuned ferroelectric resonant microwave oscillator, which comprises:

amplifier means for providing voltage gain to a RF output port of said oscillator;

power split means for providing a feedback loop to said amplifier means and an electrical connection to said RF outport;

ferroelectric resonator means operatively positioned in said feedback loop for providing broad band voltage tuning of said oscillator;

input network means operatively coupled intermediate said resonator means and said amplifier means for minimizing impedance mismatch between said resonator means and said amplifier means;

output network means operatively coupled intermediate said power split means and said amplifier means for minimizing impedance mismatch between said power split means and said amplifier means; and ferroelectric voltage driver means for providing a DC biasing voltage for said resonator means.

2. A voltage tuned ferroelectric oscillator as recited in claim 1 wherein said amplifier means includes:

a first microwave amplifier electrically coupled to said resonator means, and a second microwave amplifier operatively coupled intermediate said first amplifier and said power split means.

3. A voltage tuned ferroelectric oscillator as recited in claim 2, wherein said ferroelectric resonator means includes:

ferroelectric material means, having first and second plated sides, for having a dielectric constant dependent on an electric field within said material means; and an external D.C. voltage source electrically coupled to said first and second plated sides for setting up a biasing voltage within in said ferroelectric material means, wherein the permittively of said ferroelectric material means is controlled by said D.C. voltage means.

4. An oscillator as recited in claim 3 wherein said resonator means includes:

a microstrip trace member having a ground plate in contact with said first and second plated sides;

a dielectric member in juxtaposition with said ferroelectric means; and microstrip capacitance coupling gaps, said microstrip trace member having parameters unaffected by the addition of said DC voltage means, and said addition of said DC voltage means changing said ferroelectric resonator means overall capacitance and in turn the resonant frequency of said oscillator.

5. An oscillator as recited in claim 4 wherein said input network means includes input matching stub means for minimizing electromagnetic voltage reflections at an in-port of said amplifier means.

6. An oscillator as recited in claim 5 wherein said output network means includes output network means for minimizing electromagnetic voltage reflections at an output port of said amplifier means.

7. An oscillator as recited in claim 5 wherein said input network means further includes gate bias stub elements having gate resistors therein connected to said ground plate.

8. An oscillator as recited in claim 6 wherein said output network means further includes drain bias stub elements having drain bias stub tank resistors and tank capacitors electrically coupled to said ground plate.

9. An oscillator as recited in claim 1 wherein said ferroelectric resonator means includes a control element that has rapid broadband frequency tuning capability limited only by the speed of said external DC voltage source biasing voltage.

10. An oscillator as recited in claim 9 wherein said ferroelectric material means includes a ferroelectric material having inherent polarity independent properties which protect said ferroelectric resonator means from burnout due to incorrect biasing or unstable voltage fluctuations.

* * * * *